(12) United States Patent
Okui et al.

(10) Patent No.: US 7,359,693 B2
(45) Date of Patent: Apr. 15, 2008

(54) ENCLOSURE AND SUBSTRATE STRUCTURE FOR A TUNER MODULE

(75) Inventors: Kazunori Okui, Newark, CA (US); Hiroshi Ogasawara, Yokohama (JP); Takatsugu Kamata, Yokohama (JP); Keiichi Fujii, San Jose, CA (US); Christopher Li, Sunnyvale, CA (US)

(73) Assignee: RfStream Corporation, Osaka (JP)

( * ) Notice: Subject to any disclaimer, the term of this patent is extended or adjusted under 35 U.S.C. 154(b) by 671 days.

(21) Appl. No.: 10/852,590

(22) Filed: May 23, 2004

(65) Prior Publication Data

US 2005/0017830 A1 Jan. 27, 2005

Related U.S. Application Data

(60) Provisional application No. 60/473,067, filed on May 23, 2003.

(51) Int. Cl.
*H04B 1/10* (2006.01)
*H05K 7/06* (2006.01)

(52) U.S. Cl. ............... 455/301; 455/307; 174/255; 174/266; 361/762; 361/818

(58) Field of Classification Search ............... 455/300, 455/301; 361/748, 750, 752, 753, 760, 764, 361/816, 818, 762–763, 761; 174/255, 350, 174/250, 264
See application file for complete search history.

(56) References Cited

U.S. PATENT DOCUMENTS

| | | | | |
|---|---|---|---|---|
| 4,370,515 A | * | 1/1983 | Donaldson | 174/387 |
| 4,861,941 A | | 8/1989 | Kubo et al. | |
| 4,920,455 A | * | 4/1990 | Maier et al. | 361/814 |
| 5,014,160 A | * | 5/1991 | McCoy, Jr. | 361/818 |
| 5,034,856 A | * | 7/1991 | Cook et al. | 361/816 |
| 5,218,234 A | | 6/1993 | Thompson et al. | |
| 5,371,404 A | | 12/1994 | Juskey et al. | |
| 5,375,322 A | | 12/1994 | Leeb | |
| 5,423,080 A | * | 6/1995 | Perret et al. | 455/90.3 |
| 5,475,876 A | * | 12/1995 | Terada et al. | 455/301 |

(Continued)

FOREIGN PATENT DOCUMENTS

EP 0429037 B1 3/1994

OTHER PUBLICATIONS

Written Opinion of the International Searching Authority for Related Foreign Application PCT/IB2004/002082.

*Primary Examiner*—Blane J. Jackson
(74) *Attorney, Agent, or Firm*—Stattler-Suh PC

(57) ABSTRACT

A tuner module comprising a tuner and a tuner enclosure. The tuner includes a substrate containing filter coils and the tuner enclosure includes at least one partition plate placed between filter coils of the tuner to improve the isolation between the filter coils. The substrate may also contain plated through holes placed beneath a partition plate which further improves isolation between the filter coils. In some embodiments, the substrate is comprised of a coil layer having a planar coil, a shield layer, and a dielectric layer. The dielectric layer is placed between the coil and shield layers and provides a distance between the two layers to achieve a particular quality factor level of the planar coil. In some embodiments, the tuner enclosure further includes a shielding case that extends to the base of the substrate, is comprised of a metal material, and is mechanically connected with the substrate.

20 Claims, 9 Drawing Sheets

U.S. PATENT DOCUMENTS

| | | | | |
|---|---|---|---|---|
| 5,581,217 A * | 12/1996 | Macdonald | | 333/246 |
| 5,656,857 A | 8/1997 | Kishita | | |
| 5,710,999 A * | 1/1998 | Iwase et al. | | 455/349 |
| 5,801,521 A | 9/1998 | Mizoguchi et al. | | |
| 5,991,162 A | 11/1999 | Saso | | |
| 6,094,350 A * | 7/2000 | Achiriloaie | | 361/737 |
| 6,118,672 A * | 9/2000 | Yamauchi et al. | | 361/818 |
| 6,373,711 B2 * | 4/2002 | Yamauchi et al. | | 361/752 |
| 6,380,608 B1 | 4/2002 | Bentley | | |
| 6,495,903 B2 * | 12/2002 | Xu et al. | | 257/531 |
| 6,723,627 B1 | 4/2004 | Kariyazaki et al. | | |
| 6,747,879 B2 * | 6/2004 | Baker | | 361/818 |
| 6,903,938 B2 * | 6/2005 | Waffenschmidt | | 361/779 |
| 2002/0104681 A1 * | 8/2002 | Ishiwa et al. | | 174/250 |
| 2003/0067349 A1 | 4/2003 | Muramatsu | | |
| 2006/0223481 A1 | 10/2006 | Kamata | | |

* cited by examiner

ENCLOSURE AND SUBSTRATE STRUCTURE FOR A TUNER MODULE

RELATED APPLICATIONS

This patent application claims the benefit to the U.S. Provisional Patent Application entitled "A Module Structure for a Television Tuner," having Ser. No. 60/473,067 filed on May 23, 2003.

FIELD OF THE INVENTION

This invention is generally related to a tuner and, more particularly, is directed toward a tuner enclosure and substrate.

BACKGROUND OF THE INVENTION

Prior art tuners (such as television tuners) and enclosures for tuners contain a number of sub-optimal aspects. For instance, tuners are often comprised of a substrate containing a shield layer that is located in a position that adversely affects the quality factor (i.e., Q-factor) of filter coils used in filters of the tuner. Furthermore, prior art tuners and tuner enclosures often must be made overly large to allow for relative isolation of filter coils in the tuner. If the filter coils of the tuner are not spaced properly, then interference between them occurs. This need for filter coil isolation prevents reducing the size of tuners and tuner enclosures.

Accordingly, there is a need for a tuner and tuner enclosure that minimizes interference between components, improves the Q-factor of filter coils in the tuner, improves the symmetrical placement of coils, and incorporates the various components of the tuner into a smaller space.

SUMMARY OF THE INVENTION

According to one aspect of the present invention, there is provided a tuner module comprising a tuner and a tuner enclosure. The tuner includes a substrate containing filter coils (used in filters of the tuner) located on one or more layers of the substrate. The tuner enclosure includes at least one partition plate placed between filter coils of the tuner to improve the isolation between the filter coils. In some embodiments, a partition plate is placed between different filter coil types of the tuner.

In some embodiments, the substrate has plated through holes that are placed adjacent to and beneath a partition plate which further improves isolation between the filter coils. In some embodiments, plated through holes are placed along an outer edge of the substrate to reduce radiation. In some embodiments, two or more plated through holes are electrically connected to each other to provide further shielding and isolation. In some embodiments, one or more plated through holes are electrically connected to a shield layer of the substrate.

In some embodiments, the substrate is comprised of several layers including a coil layer having a planar coil, a shield layer, and a dielectric layer. The dielectric layer is placed between the coil and shield layers and provides a distance between the two layers to achieve a particular quality factor level of the planar coil.

In some embodiments, the substrate has a recession where a top-mounted component is placed within the recession to allow for a tuner module of reduced height. In some embodiments, the substrate contains an air chamber placed between layers of the substrate having planar coils to reduce parasitic capacitance and improve the self-resonant frequency.

In some embodiments, the tuner enclosure also includes a base frame that gives the partition plates structural rigidity and strength. Typically, the base frame is metal connected or chemically connected with the substrate and is made of a metal material.

In some embodiments, the tuner enclosure further includes a shielding case that extends to the base of the substrate, is comprised of a metal material, and is mechanically connected with the substrate. In some embodiments, the shielding case has a hole in the case where a top-mounted component mounted atop the substrate can protrude to allow for a tuner module of reduced height.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION OF THE INVENTION

The disclosures of U.S. Provisional Patent Application No. 60/473,067, filed on May 23, 2003, entitled "A Module Structure for a Television Tuner," is hereby expressly incorporated herein by reference.

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

Figure 1:
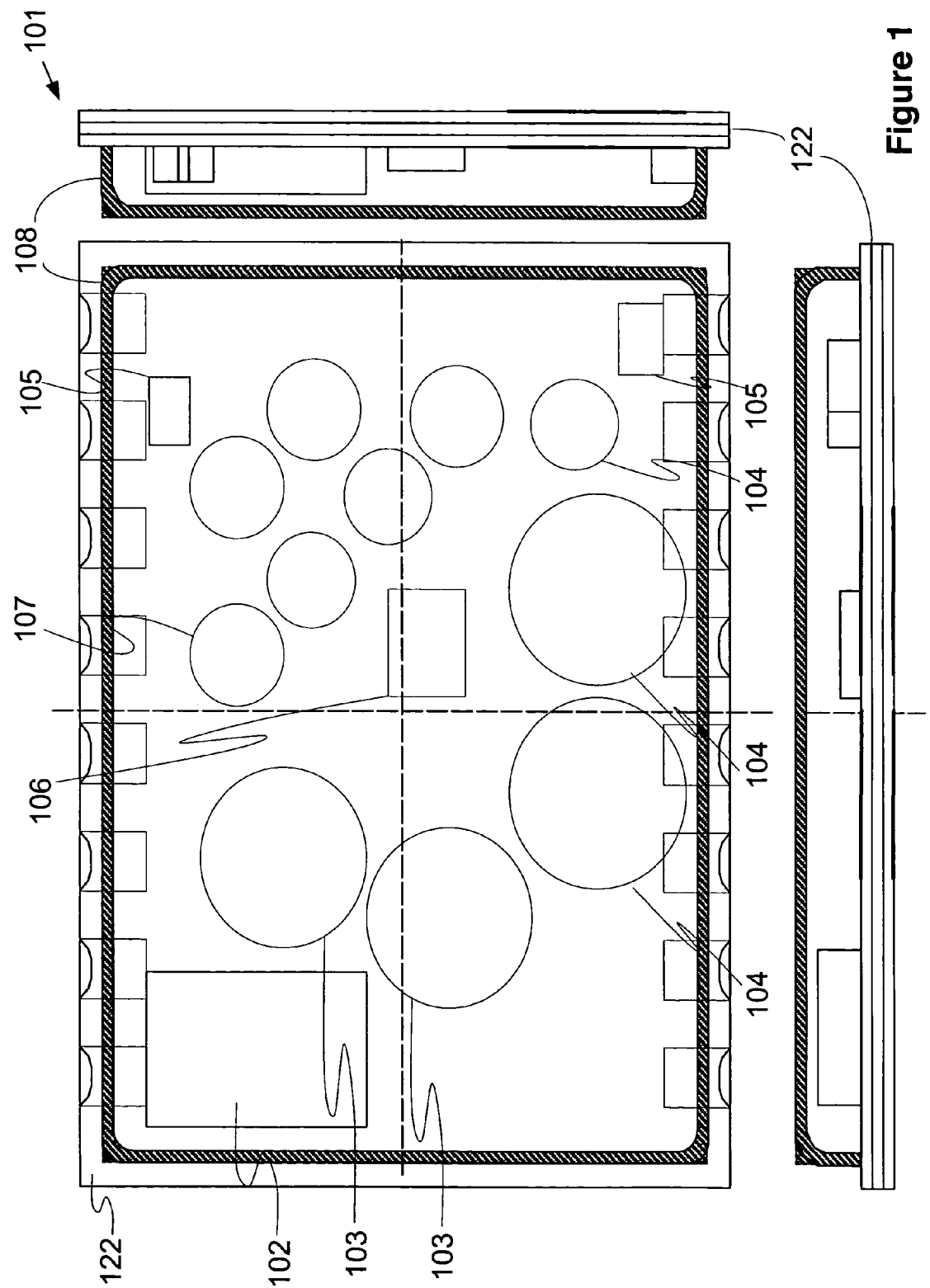
FIG. 1 illustrates a tuner module design that is not optimized with respect to size or interference.

FIG. 1 illustrates an example of a design of a tuner module 101 that is not optimized with respect to size or interference. A top view and two different side views of the tuner module design are shown. The tuner module 101 includes a tuner and a tuner enclosure 108. The tuner is comprised of a substrate 122 and various top-mounted components 102, 105, and 106 (represented as four-sided polygons in FIG. 1) that are mounted atop the substrate 122. The tuner enclosure 108 covers the tuner module 101.

The substrate 122 is typically a printed circuit board that contains filter coils 103, 104, and 107 (represented as circles in FIG. 1). Filter coils include, for example, intermediate frequency ("IF") coils 103, first stage radio frequency ("RF") coils 104, and second stage radio frequency ("RF") coils 107. The filter coils 103, 104, and 107 generate inductances and are used in filters of the tuner for processing of signals. For example, the IF coils 103 are used to implement filters for IF processing of signals and the RF coils 104 and 107 are used to implement filters for one or more stages of RF processing. Top-mounted components typically include various electrical components 102 and 105 (e.g., resistors, transistors, etc.), integrated circuits 106, etc. that are mounted on the substrate 122.

Figure 2:
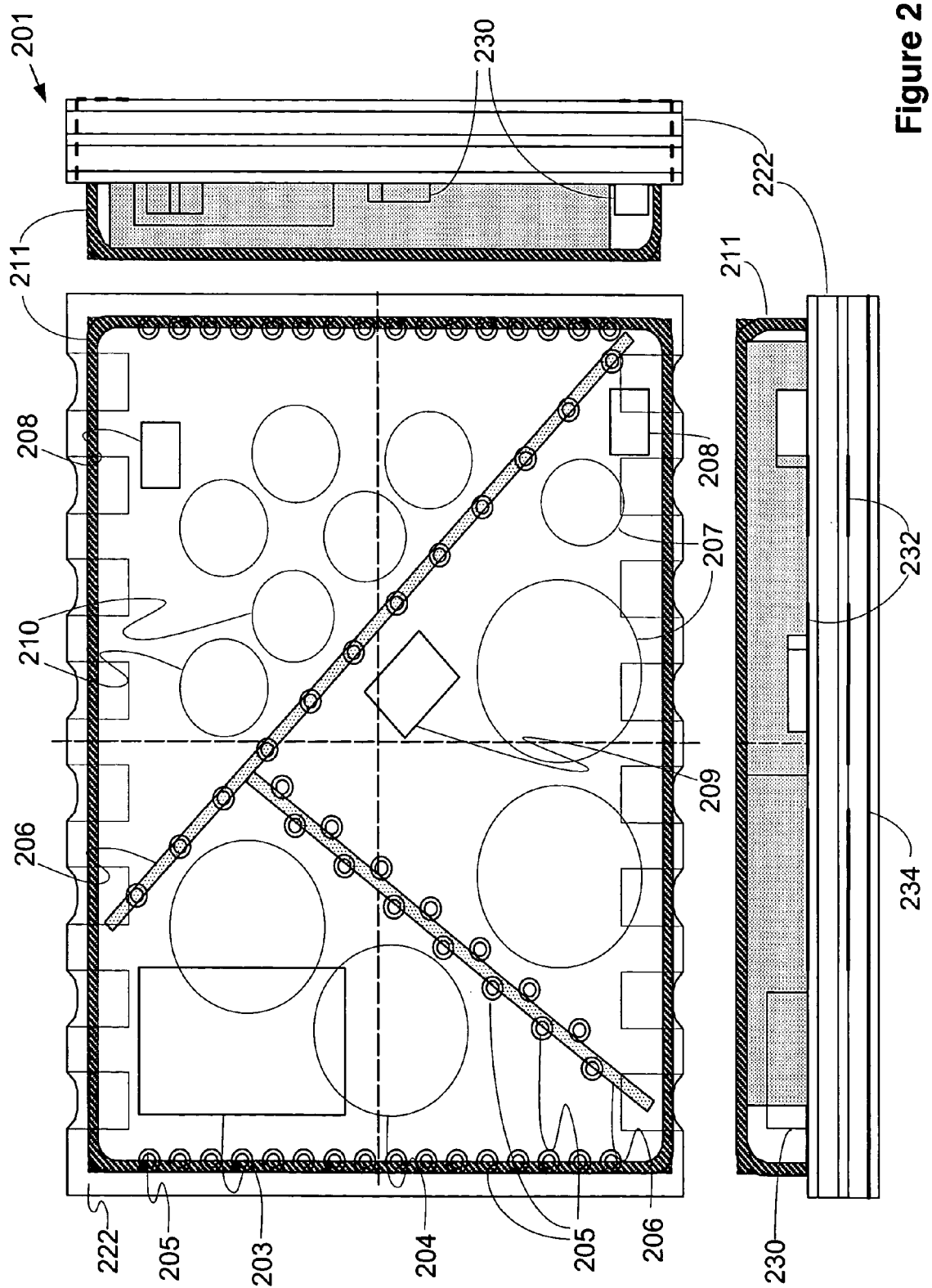
FIG. 2 illustrates a tuner module design that is optimized with respect to size and interference.

FIG. 2 illustrates one embodiment of a design of a tuner module 201 (i.e., tuner and tuner enclosure) that is optimized with respect to size and interference. A top view and two different side views of the tuner module design are shown. The tuner module 201 is comprised of a tuner and a tuner enclosure.

The tuner is comprised of a substrate 222 and various top-mounted components 203, 208, and 209 (represented as four-sided polygons in FIG. 2) that are mounted atop the substrate 222. The substrate 222 (printed circuit board) contains filter coils 204, 207, and 210 (represented as circles in FIG. 2) located within the substrate 222 itself. Filter coils include, for example, IF coils 204, first stage RF coils 207, and second stage RF coils 210. In some embodiments, a filter coil is comprised of one or more planar coils (as discussed below in relation to FIG. 4). Top-mounted components may include various electrical components 203 and 208 (e.g., resistors, transistors, etc.), integrated circuits 209, etc. that are mounted on the substrate 222.

In contrast to FIG. 1, the top-mounted components 203, 208, and 209 are in closer proximity to the various filter coils 204, 207, and 210 than their counterparts 102, 105, and 106 in FIG. 1. Also, the integrated circuit 209 is tilted with respect to its counterpart 106 in FIG. 1. The tilted alignment of the integrated circuit 209 in FIG. 2 improves the symmetrical placement of filter coils 204, 207, and 210, reduces module size 201, and simplifies the placement of partition plates 206.

The tuner enclosure of the tuner module 201 is connected with and covers the tuner and substrate 222. The tuner enclosure is comprised of a shielding case (lid) 211 and one or more partition plates 206. The shielding case 211 encloses the tuner and is typically comprised of a metal material. The one or more partition plates 206 stand approximately perpendicular to the substrate 222 and are placed between filter coils of the tuner to improve the isolation between the filter coils. In some embodiments, a partition plate 206 is placed between different filter coil types of the tuner, where examples of different coil types include IF coils, first stage RF coils, and second stage RF coils. In the example shown in FIG. 2, a partition plate is placed between the IF coils 204, the first stage RF coils 207, and the second stage RF coils 210.

In contrast to FIG. 1, the substrate 222 of the tuner includes one or more plated through holes 205 in various locations. In some embodiments, one or more plated through holes 205 are placed at an outer edge of the substrate or shielding case to reduce radiation. Typically, plated through holes 205 are placed along at least two edges of the tuner or shielding case. In some embodiments, one or more plated through holes 205 are adjacent to and placed under a partition plate 206 which improves the isolation between the filter coils (that the partition plate separates) and reduces additional peak or trap frequency of signals. Typically, there are at least two partition plates 206 in the tuner enclosure and at least two plated through holes 205 adjacent to and beneath each partition plate 206.

Figure 10:
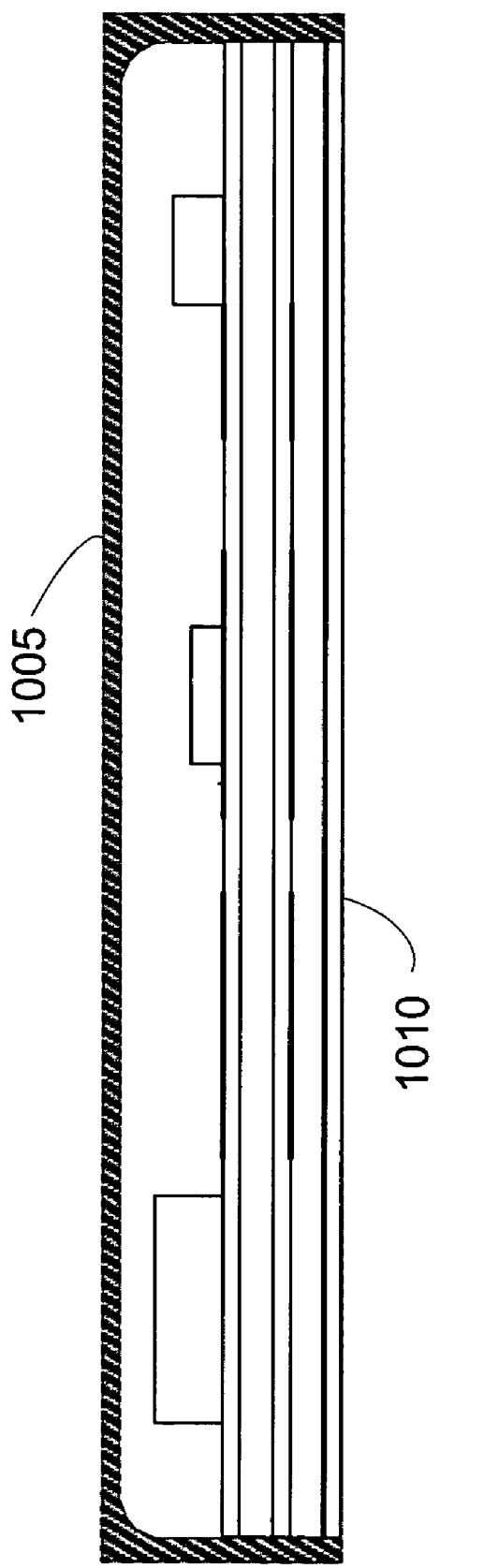
FIG. 10 shows a design of an alternative shielding case that extends to the base of the tuner module or substrate.

The side views of the tuner module 201 show the various top-mounted components 230 placed atop the substrate 222. The substrate also contains various planar coils 232 that comprise a filter coil. The substrate further contains a shielding layer 234 (discussed below in relation to FIG. 4). In the side views, the shielding case 211 covers the substrate 222 and is shown to be placed atop the substrate 222. In other embodiments, the shielding case 211 encloses the substrate 222 and extends to the base (bottom) of the tuner module or substrate 222 (as shown in FIG. 10).

Figure 3:
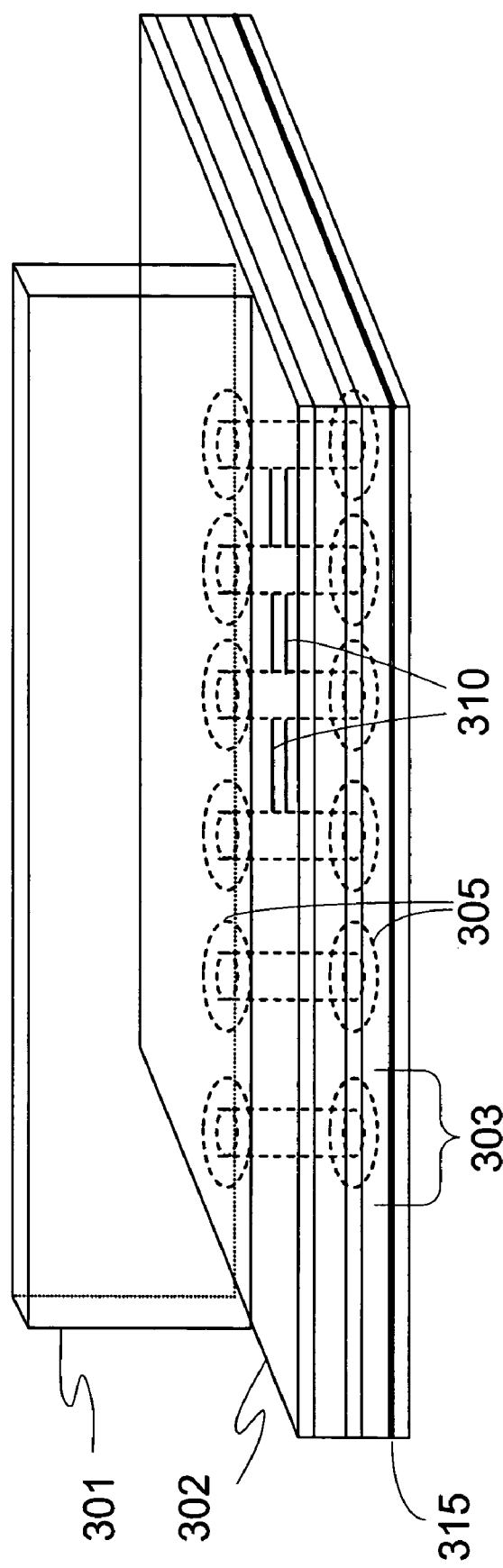
FIG. 3 illustrates one embodiment for placing a partition plate and plated through holes in a substrate.

FIG. 3 illustrates one embodiment of a partition plate 301 and plated through holes 303 on a substrate 302 of a tuner. FIG. 3 shows a cross-sectional view of the substrate 302. Placed atop the substrate 302 and standing approximately perpendicular to the substrate 302 is a partition plate 301. The partition plate 301 may be made of a variety of materials, but is typically metal (e.g., copper). Adjacent to and located below the partition plate 301 are a number of plated through holes 303. In some embodiments, the configuration and placement of the partition plate 301 and the plated through holes 303 is similar to the configuration and placement of the partition plates 206 and plated through holes 205 shown in FIG. 2.

As shown in FIG. 3, a plated through hole 303 is a hole having a top and bottom opening, the hole going through the entirety of the substrate 302. In other embodiments, however, a plated through hole 303 does not go through the entirety of the substrate 302 and only has a top or bottom opening. In some embodiments, a plated through hole 303 has a ring 305 at each opening of the hole, where the ring 305 may be plated with a variety of metals, such as copper. As such, the plated through hole 303 is plated with a metal ring that reflects radiation to provide further shielding and isolation of the filter coils in the tuner. In some embodiments, there is a thin layer of metal plating covering the inside of the plated through holes 303.

Substrates are typically nonconductive but have traces (interconnections) that run along a layer of the substrate to electrically connect particular components that exist within the substrate or are mounted atop the substrate. In some embodiments, two or more plated through holes 303 are electrically connected to each other through one or more traces 310 between the two or more plated through holes 303. The two or more plated through holes 303 may be electrically connected to each other through multiple traces 310 that run along different layers of the substrate. The two or more plated through holes 303 that are electrically connected to each other may be located beneath a partition plate or at the outer edge of the substrate or shielding case. By electrically connecting plated through holes to each other, further shielding and isolation can be achieved.

In some embodiments, one or more plated through holes 303 are electrically connected to a shield layer 315 of the substrate 302. Since the inside of a plated through hole 303 is typically plated with metal, in these embodiments, an opening for the plated through hole in the shielding layer is made tight enough so that the shielding layer makes contact with the plated through hole 303 going through the shielding layer. In this way, a plated through hole 303 can be electrically connected to the shield layer 315. The one or more plated through holes 303 that are electrically connected to the shield layer 315 may be located beneath a partition plate or at the outer edge of the substrate or shielding case. By electrically connecting plated through holes to the shield layer, further shielding and isolation can be achieved. In other embodiments, a plated through hole 303 is not electrically connected to a shielding layer of a substrate. In these embodiments, an opening for a plated through hole in the shielding layer is made large enough so that the shielding layer does not make contact with the plated through hole 303 going through the shielding layer.

Figure 4:
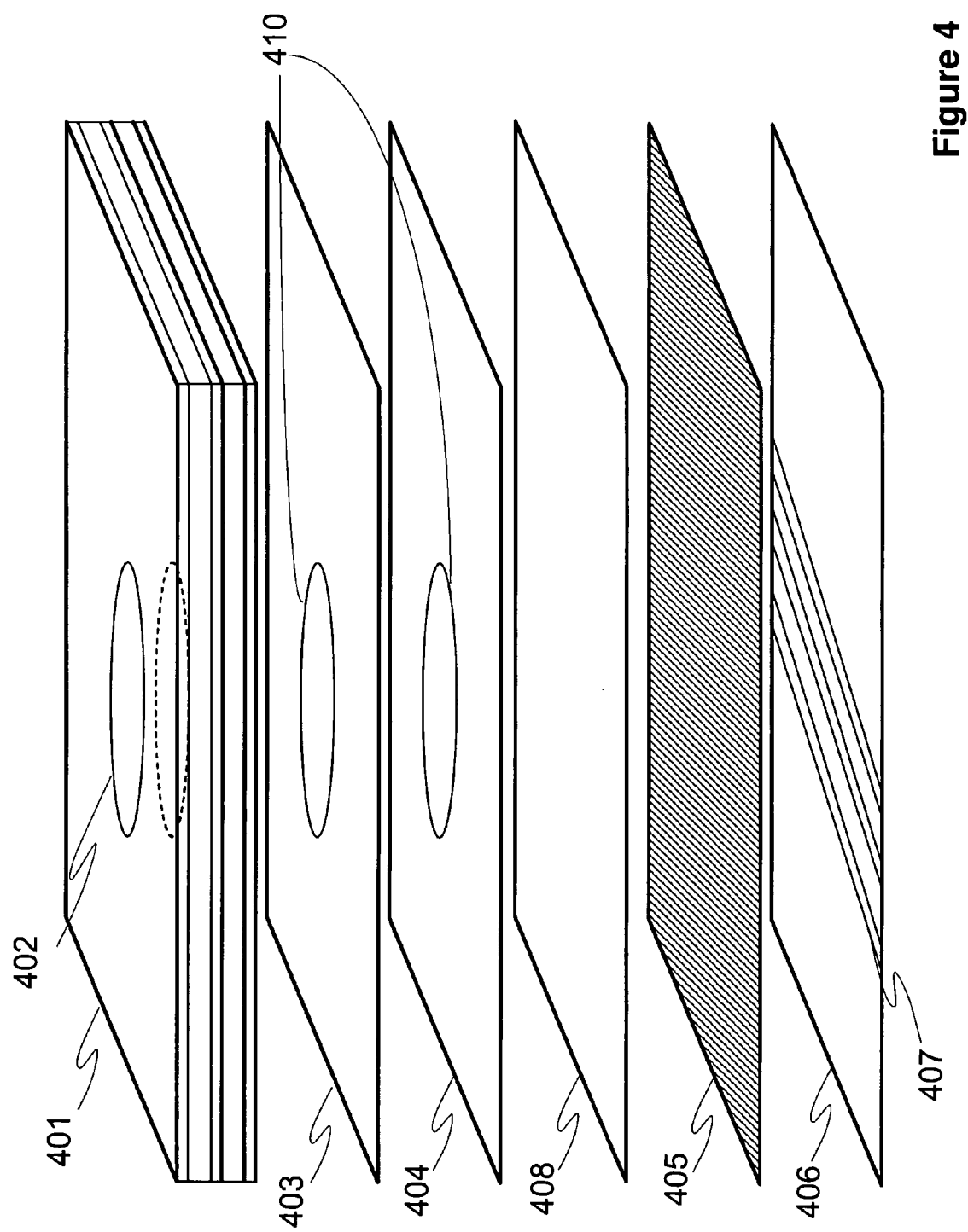
FIG. 4 illustrates one embodiment for placing a shield layer in a substrate.

FIG. 4 illustrates one embodiment of a shield layer in a substrate. FIG. 4 illustrates an exploded view of a substrate 401 that is comprised of several layers. As shown in FIG. 4, the substrate 401 contains a filter coil 402 comprised of one or more planer coils 410 that are present on one or more layers (referred to as coil layers) of the substrate 401. Each planer coil 410 is comprised of wires or metal traces on a layer of the substrate 401. In some embodiments, a planer coil 410 is present on a top layer 403 and a fourth layer 404 of the substrate 401. In the example shown in FIG. 4, a bottom layer 406 of the substrate 401 may be a layer containing traces 407.

The substrate 401 also contains a shield layer 405 that may be made of a variety of materials, but is typically metal (e.g., copper). The shield layer 405 is a conductive layer that reflects radiation and reduces electromagnetic interference (EMI). As the shield layer 405 of the substrate is placed closer to a filter coil, the Q-factor of the filter coil becomes lower. In some embodiments, a dielectric layer 408 is placed between and provides an adequate distance between the filter coil 402 and the shield layer 405 to reduce radiation and increase the Q-factor of the filter coil. The thickness of the dielectric layer 408 can be varied and is predetermined to provide a distance between the filter coil 402 and the shield layer 405 that achieves a desired Q-factor level (as discussed below in relation to FIG. 8). In some embodiments, an air chamber is placed between and provides an adequate distance between the filter coil 402 and the shield layer 405 (as discussed below in relation to FIG. 7). Typically, a dielectric layer 408 is also placed between layers of the substrate containing planer coils 410.

Figure 5:
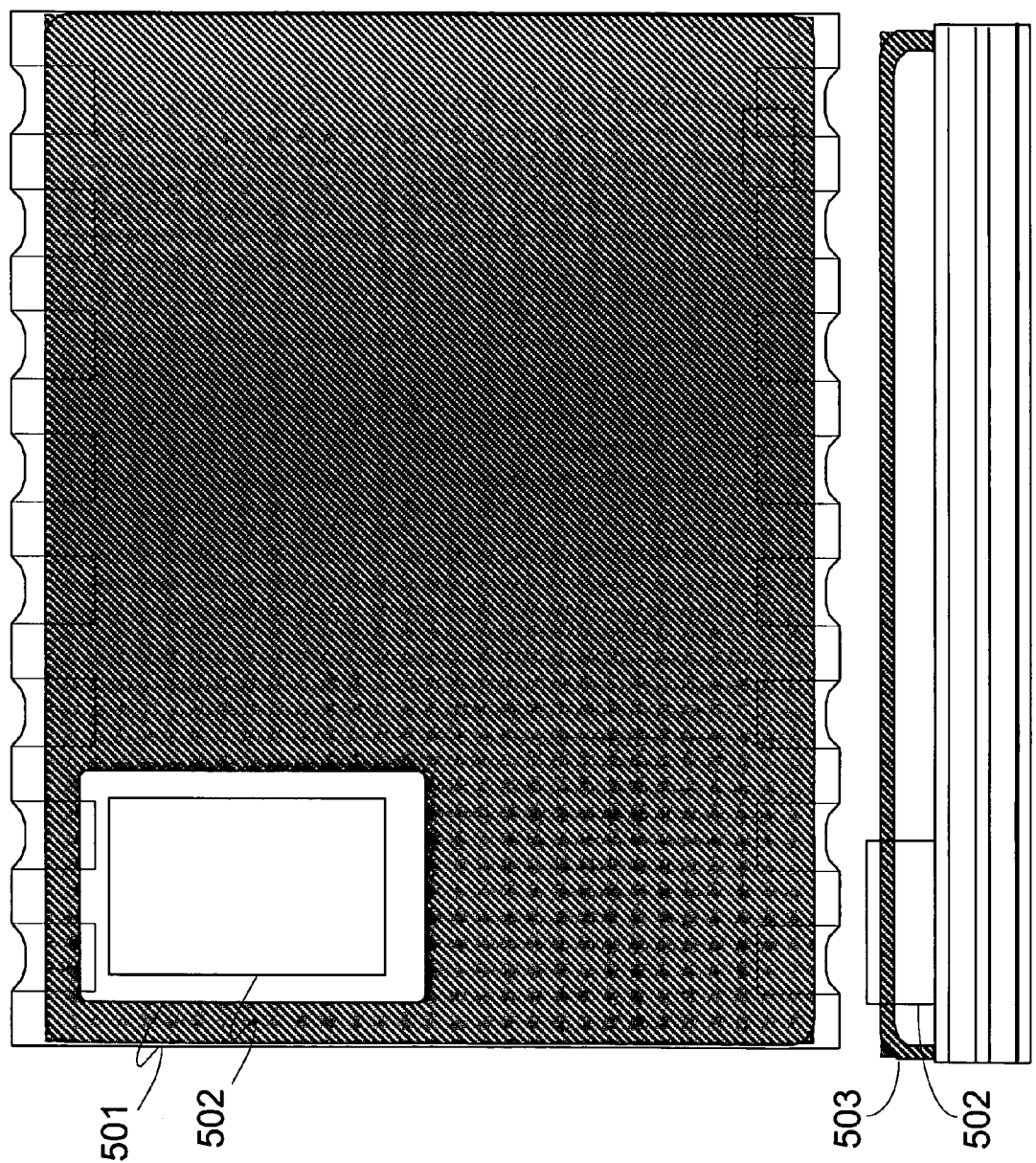
FIG. 5 illustrates a tuner module of reduced height having a hole in the shielding case.

FIG. 5 illustrates a tuner module and shielding case 503 of reduced height for an RF circuit, such as a television tuner. A hole 501 is included in the shielding case 503 that covers the tuner module. This allows a top-mounted component 502 (such as an integrated circuit, etc.) to protrude through the hole 501 to allow the height of the tuner module and shielding case to be reduced.

Figure 6:
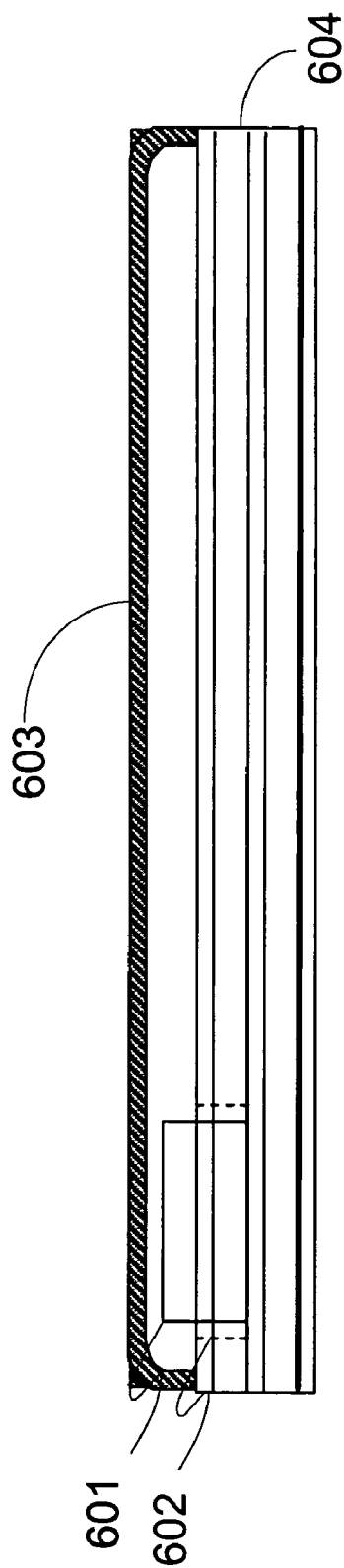
FIG. 6 illustrates another tuner module of reduced height having a recession in the substrate.

FIG. 6 also illustrates a tuner module and shielding case 603 of reduced height for an RF circuit, such as a television tuner. For this embodiment, a recession (hole) 602 is provided in the substrate 604 of the tuner module. This allows a top-mounted component 601 (such as an integrated circuit, etc.) to be placed in and lie in the recession 602, which again allows for a tuner module and shielding case 603 of reduced height.

Figure 7:
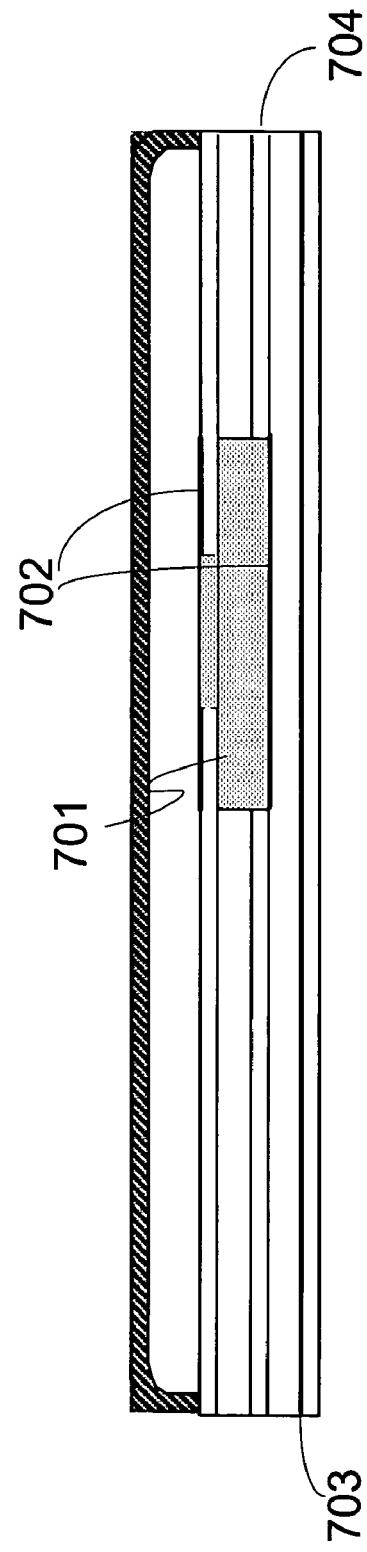
FIG. 7 illustrates the placement of an air chamber or low dielectric material in a substrate.

FIG. 7 illustrates the placement of an air chamber or low dielectric material in a substrate 704. As shown in FIG. 7, an air chamber 701 is placed between planar coils 702 in a substrate 704. The air chamber 701 may be placed between planar coils 702 that are present on different layers of the substrate or be placed between two planar coils 702 that are present on the same layer of the substrate. Such placement of an air chamber reduces parasitic capacitance and improves the self-resonant frequency. In some embodiments, the air chamber traverses one or more layers of the substrate. In some embodiments, a low dielectric material is used instead of an air chamber and placed in a similar position. In some embodiments, an air chamber 701 is placed between a planar coil 702 and a shield layer 703 of the substrate 704.

Figure 8:
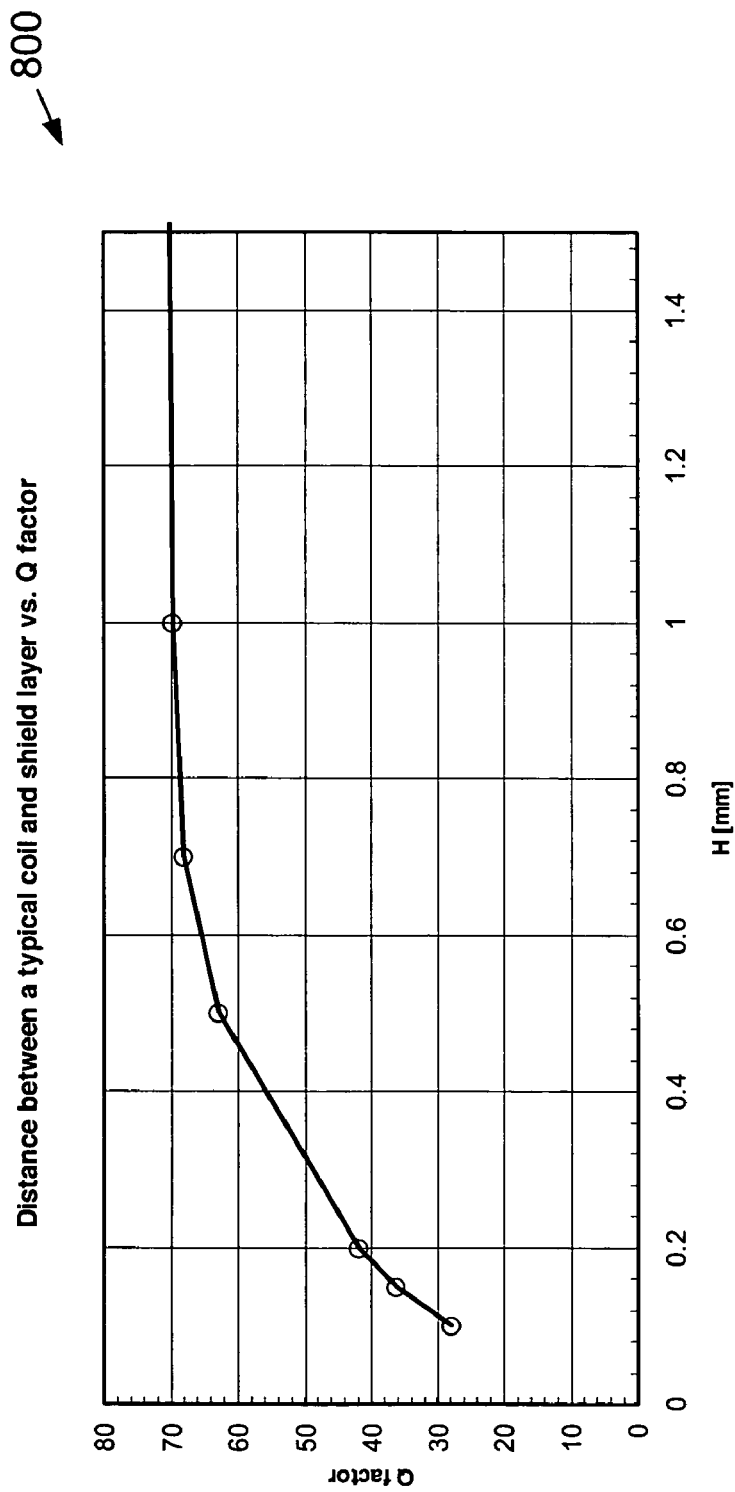
FIG. 8 is a graph that illustrates the effect of distance between a filter coil and a shield layer on the Q-factor of the filter coil.

FIG. 8 is a graph 800 that illustrates the effect of distance between a coil and a shield layer on the Q-factor of the coil. As shown in FIG. 8, as the distance between a coil and a shield layer increases (shown in millimeters along an x-axis of the graph), the Q-factor of the coil also increases (shown along a y-axis of the graph). In some embodiments, a dielectric layer is placed between and provides an adequate distance between a coil and the shield layer of a substrate where the thickness of the dielectric layer is predetermined to achieve a desired Q-factor level.

Figure 9:
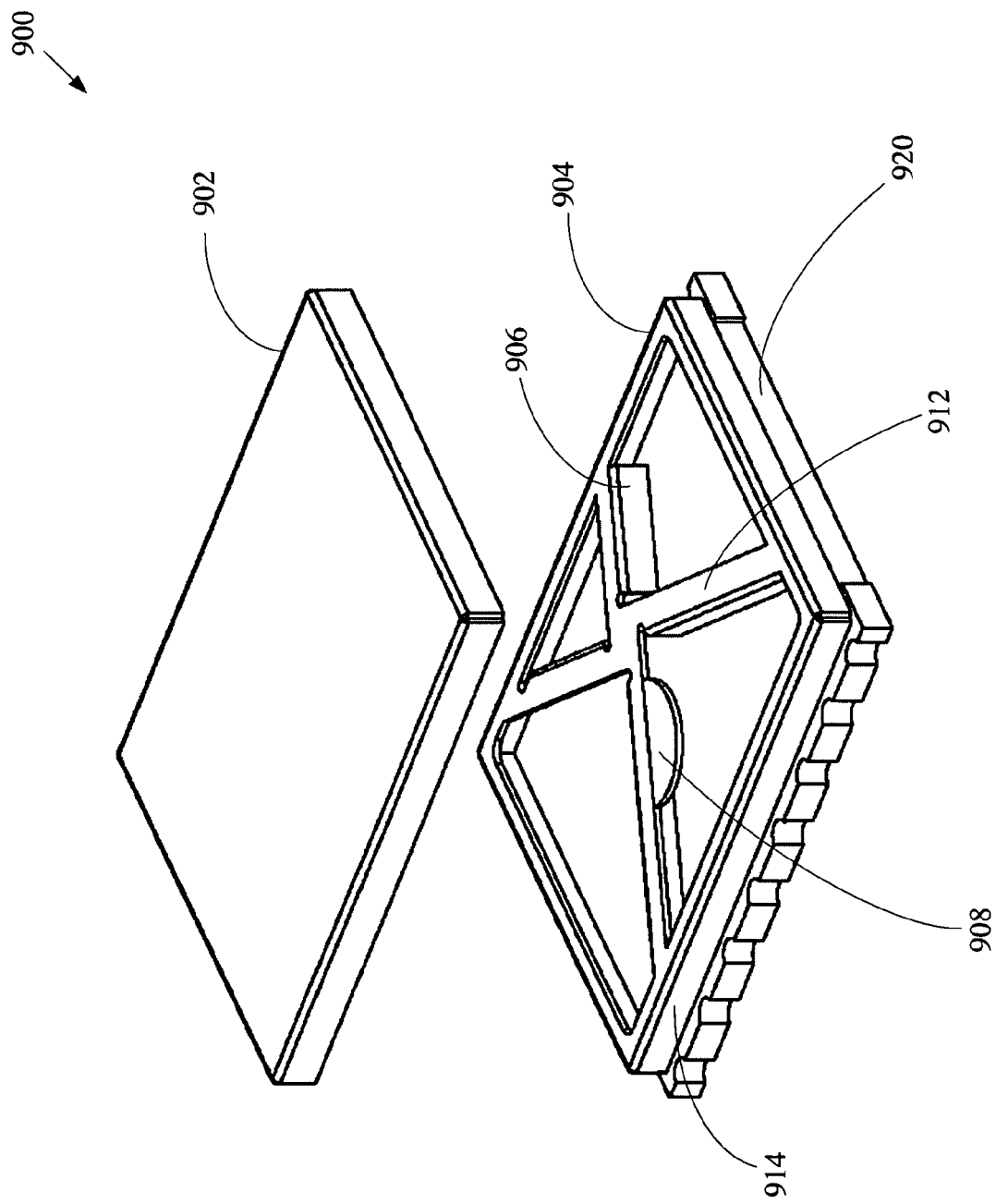
FIG. 9 shows a design of an alternative tuner enclosure comprised of a shielding case and a base frame.

FIG. 9 shows a design of an alternative tuner enclosure 900 comprised of a shielding case 902 and a base frame 904. In some embodiments, the shielding case 902 is mechanically connected with a substrate 920 (e.g., through a snap fit connection). In some embodiments, the base frame 904 is metal connected or chemically connected with the substrate 920 (e.g., through soldering). As such, the base frame 904 is more solidly affixed to the substrate 920 than the shielding case 902.

The base frame 904 is comprised of frame sides 914, one or more frame tracks 912, one or more partition plates 906, and one or more frame tabs 908. Relative to the substrate 920 to which the base frame 904 is attached, the frame sides 914 and partition plates 906 stand approximately perpendicular to the substrate 920. The frame tabs 908 and frame tracks 912 are above the substrate and extend parallel to the substrate 920. A frame track 912 is connected with a frame side 914 and extends towards the middle of the base frame 904 towards another frame side 914.

A frame tab 908 and a partition plate 906 are connected with a frame track 912. Having partition plates 906 attached to a frame track 912 and base frame 904 rather than standing alone gives the partition plates 906 more structural rigidity and stability and provides the partition plates 906 with enough mechanical strength. A frame tab 908 may be used in manufacturing processes of the tuner or tuner enclosure. For example, a frame tab 908 may be used handle or manipulate the tuner or tuner enclosure.

FIG. 10 shows a design of an alternative shielding case 1005 that encloses a tuner module or substrate 1010 and extends to the base (bottom) of the tuner module or substrate 1010. By extending the shielding case 1005 to the base of the substrate 1010, further reduction of electromagnetic radiation from the tuner module can be achieved.

Although the present invention has been described in terms of specific exemplary embodiments, it will be appreciated that various modifications and alterations might be made by those skilled in the art without departing from the spirit and scope of the invention.

The invention claimed is:

1. A tuner module comprising:
   a substrate comprising:
      at least two coils, each coil comprising one or more planar coils that are present on one or more layers of the substrate;
      an air chamber in the substrate, the air chamber being placed between two planar coils in the substrate; and
      at least one plated through hole in the substrate; and
   an enclosure comprising at least one partition plate placed between the two coils, wherein the at least one plated through hole is located adjacent to the partition plate.

2. The tuner module of claim 1 wherein the partition plate stands approximately perpendicular to the substrate and is comprised of a metal material.

3. The tuner module of claim 1 wherein the at least one plated through hole is located below the partition plate.

4. The tuner module of claim 1 wherein:
the substrate further comprises at least three coils and at least two plated through holes in the substrate; and
the enclosure further comprises at least two partition plates, each partition plate being placed between two coils, wherein at least one plated through hole is located below each partition plate.

5. The tuner module of claim 1 wherein the substrate further comprises at least one plated through hole placed at the outer edge of the substrate.

6. The tuner module of claim 1 wherein the at least one plated through hole goes through the entirety of the substrate and comprises a metal ring at each opening of the plated through hole.

7. The tuner module of claim 1 wherein the substrate further comprises a conductive shield layer that is electrically connected to the at least one plated through hole.

8. The tuner module of claim 1 wherein:
the substrate comprises a printed circuit board comprising:
  at least one top-mounted component placed atop the substrate, the at least one top-mounted component comprising an electrical component or an integrated circuit; and
  one or more layers; and
the at least two coils are filter coils located within the substrate, each of the at least two coils being comprised of one or more planar coils that are present on one or more layers of the substrate.

9. The tuner module of claim 1 wherein the at least two coils are filter coils of different types.

10. The tuner module of claim 9 wherein a filter type comprises an intermediate frequency coil type, a radio frequency coil type, a first stage coil type, or a second stage coil type.

11. The tuner module of claim 1 wherein:
the substrate is further comprised of one or more layers including a conductive shield layer and a dielectric layer; and
each of the at least two coils is comprised of one or more planar coils that are present on one or more layers of the substrate, the dielectric layer being placed between a layer having a planar coil and the conductive shield layer.

12. A tuner module comprising:
a substrate comprising:
  an air chamber;
  one or more layers including a conductive shield layer; and
  at least two coils, wherein each of the at least two coils is comprised of one or more planar coils that are present on one or more layers of the substrate, the air chamber being placed between a layer having a planar coil and the conductive shield layer; and
an enclosure comprising at least one partition plate placed between the two coils, wherein at least one plated through hole is located adjacent to the partition plate.

13. The tuner module of claim 1 wherein the substrate further comprises a top-mounted component placed atop the substrate, the tuner module further comprising:
a shielding case that covers the substrate, the shielding case comprising a hole in the shielding case wherein the top-mounted component protrudes through the hole.

14. The tuner module of claim 1 wherein the substrate further comprises a recession in the substrate and a top-mounted component placed in the recession.

15. The tuner module of claim 1 wherein the air chamber is placed between two planar coils present on different layers of the substrate or is placed between two planar coils present on the same layer of the substrate.

16. The tuner module of claim 1 wherein the enclosure further comprises:
a base frame connected with the substrate, the base frame comprising:
  at least two frame sides;
  at least one frame track connected with a frame side and extending towards another frame side, the at least one partition plate being connected with the at least one frame track.

17. The tuner module of claim 16 wherein the base frame is metal connected or chemically connected with the substrate.

18. The tuner module of claim 16 wherein:
the at least two frame sides and the at least one partition plate stand approximately perpendicular to the substrate; and
the at least one frame track is above the substrate and extends parallel to the substrate.

19. The tuner module of claim 16 wherein the base frame further comprises:
at least one frame tab connected with the at least one frame track, the at least one frame tab being above the substrate and extending parallel to the substrate, wherein the frame tab is used in manufacturing processes for the tuner module.

20. The tuner module of claim 1 wherein the enclosure further comprises:
a shielding case that extends to the base of the substrate, is comprised of a metal material, and is mechanically connected with the substrate.

* * * * *